United States Patent [19]

Horikawa et al.

[11] Patent Number: 4,986,634
[45] Date of Patent: Jan. 22, 1991

[54] BEAM-COMBINING LASER BEAM SOURCE DEVICE

[75] Inventors: Kazuo Horikawa; Ichirou Miyagawa; Kouichi Okada, all of Kanagawa, Japan

[73] Assignee: Fuji Photo Film Co., Ltd., Kanagawa, Japan

[21] Appl. No.: 401,903

[22] Filed: Aug. 25, 1989

[30] Foreign Application Priority Data

Aug. 26, 1988 [JP] Japan .............................. 63-212235
Aug. 26, 1988 [JP] Japan .............................. 63-212236

[51] Int. Cl.$^5$ ........................ G02B 27/14; G02B 7/02
[52] U.S. Cl. .................................... 350/174; 350/253
[58] Field of Search ............... 350/169, 171, 174, 245, 350/252, 253, 255

[56] References Cited

U.S. PATENT DOCUMENTS

| 4,258,264 | 3/1981 | Kotera et al. | 250/484.1 |
| 4,276,473 | 6/1981 | Kato et al. | 250/337 |
| 4,315,318 | 2/1982 | Kato et al. | 250/337 |
| 4,387,428 | 6/1983 | Ishida et al. | 250/337 |

FOREIGN PATENT DOCUMENTS 0030856  3/1979  Japan ................................. 350/174
56-11395 10/1981 Japan .

Primary Examiner—Bruce Y. Arnold
Assistant Examiner—Ronald M. Kachmarik
Attorney, Agent, or Firm—Sughrue, Mion, Zinn, Macpeak & Seas

[57] ABSTRACT

A beam-combining laser beam source device comprising laser beam sources; collimator optical systems positioned in optical paths of laser beams radiated from the laser beam sources. Each of the collimator optical systems is constituted of a first lens section and a second lens section. Optical path adjusting elements are positioned in the optical paths of the laser beams in order to radiate the laser beams along optical paths parallel and close to one another. A support member supports the laser beam sources, the collimator optical systems, and the optical path adjusting elements. Each laser beam source and the corresponding first lens section are combined into a laser beam source unit and mounted on the support member, the positions of the laser beam source and the first lens section having been adjusted with respect to each other. The second lens section corresponding to the laser beam source unit is mounted on the support member with the position of the second lens section being adjusted with respect to the position of the laser beam source unit in a plane which is normal to the otpical axis of the laser beam source unit.

9 Claims, 6 Drawing Sheets

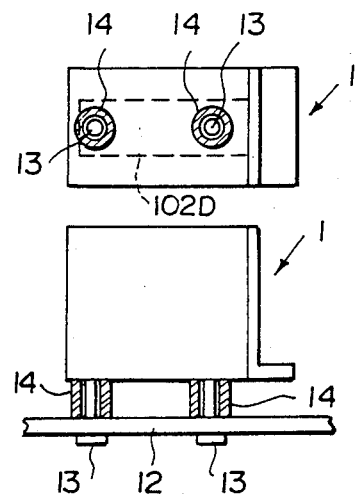
FIG. 7A
FIG. 7B
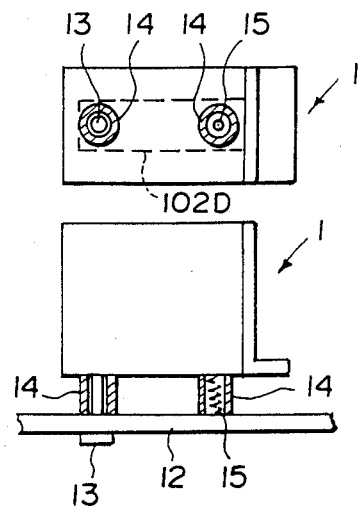
FIG. 8A
FIG. 8B
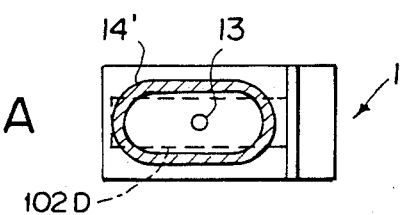
FIG. 9A
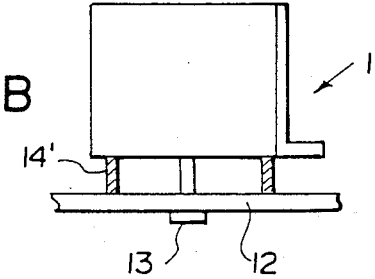
FIG. 9B

BEAM-COMBINING LASER BEAM SOURCE DEVICE

BACKGROUND OF THE INVENTION

1. Field of the Invention

This invention relates to a beam-combining laser beam source device wherein laser beams produced by a plurality of laser beam sources, such as semiconductor lasers which have a low power output, are combined so as to multiply the power of the individual laser beam sources. This invention particularly relates to a beam-combining laser beam source device which is easy to assemble.

2. Description of the Prior Art

Light beam scanning apparatuses wherein a laser beam is deflected by a light deflector in order to scan a surface with the laser beam have heretofore been widely used in, for example, scanning recording apparatuses and scanning read-out apparatuses. In such light beam scanning apparatuses, it is desired that a plurality of laser beams be combined so as to obtain the laser beams having a high intensity and the laser beams having a high intensity be used as scanning light in order to, for example, increase the speed at which the information recorded on a surface to be scanned is recorded or read out. Combination of the laser beams is required particularly when semiconductor lasers are used as the laser beam sources. Specifically, a semiconductor laser has various advantages over a gas laser or the like in that the semiconductor laser is small in size, cheap, and consumes little power, and that the laser beam can be modulated directly when the drive current applied to the semiconductor laser is changed.

However, the output power of the semiconductor laser is low (20 mW to 30 mW), when the semiconductor laser is operated in order to continuously radiate the laser beam. Therefore, the semiconductor laser is not suitable for use in a light beam scanning apparatus wherein scanning light having a high energy is used, (for example, a scanning recording apparatus wherein information is recorded on a recording material which has a low sensitivity, such as a draw material-a metal film, an amorphous film, or the like).

On the other hand, when certain kinds of phosphors are exposed to radiation such as X-rays, $\alpha$-rays, $\beta$-rays, $\gamma$-rays, cathode rays, or ultraviolet rays, they store part of the energy of the radiation. Then, when the phosphor which has been exposed to the radiation is exposed to stimulating rays such as visible light, light is emitted by the phosphor in proportion to the amount of energy stored during exposure to the radiation. A phosphor exhibiting such properties is referred to as a stimulable phosphor. In U.S. Pat. Nos. 4,258,264, 4,276,473, 4,315,318 and 4,387,428, and Japanese Unexamined Pat. Publication No. 56(1981)-11395, it has been proposed to use a stimulable phosphor in a radiation image recording and reproducing system. Specifically, a sheet provided with a layer of the stimulable phosphor (hereinafter referred to as a stimulable phosphor sheet) is first exposed to radiation which has passed through an object such as the human body, in order to store a radiation image of the object thereon, and is then scanned with stimulating rays such as a laser beam causing it to emit light in proportion to the amount of energy stored during exposure to the radiation. The light emitted by the stimulable phosphor sheet upon stimulation thereof is photoelectrically detected and converted into an electric image signal, and the image signal is used to reproduce the radiation image of the object as a visible image on a recording material such as photographic film, a display device such as a cathode ray tube (CRT), or the like.

In the aforesaid radiation image recording and reproducing system, it is desired to use a light beam scanning apparatus, wherein a semiconductor laser is used, in order to scan the stimulable phosphor sheet on which a radiation image has been stored, thereby to read out the radiation image. However, in order to quickly read out the radiation image from the stimulable phosphor sheet, it is necessary to irradiate stimulating rays which have a sufficiently high energy onto the stimulable phosphor sheet. Accordingly, it is not always possible to use a light beam scanning apparatus, wherein a semiconductor laser is used, in order to read out an image in the radiation image recording and reproducing system.

In order to obtain a scanning laser beam having a sufficiently high energy from a semiconductor laser, or the like having low power outputs, a plurality of laser beam sources may be used, and laser beams radiated from the laser beam sources may be combined so as to multiply the power of the individual laser beam sources.

In general, in order to combine the laser beams produced by a plurality of laser beam sources, the laser beams produced by the laser beam sources are collimated respectively by collimator lenses, guided along optical paths parallel and close to one another, and converged to a common spot by a converging lens. Also, in, for example, U.S. patent application No. 310,997, now U.S. Pat. No. 4,924,321, a beam-combining laser beam source device is provided with a plurality of laser beam sources and efficiently combines laser beams. The laser beam source device proposed comprises a plurality of laser beam sources, collimator optical systems positioned in optical paths of laser beams radiated from the laser beam sources, in order to collimate the laser beams, and optical path adjusting elements positioned respectively in the optical paths of the laser beams in order to radiate the laser beams along optical paths parallel and close to one another. The laser beam sources, the collimator optical systems, and the optical path adjusting elements are supported on a single member. With the proposed laser beam source device, when the laser beams radiated from the laser beam source device are caused to impinge upon a converging lens, the laser beams can be converged to a single spot at a desired position. Each of the collimator optical systems is composed of a plurality of lenses.

In order to accurately combine the laser beams in the laser beam source device described above, it is necessary to accurately adjust the positions of the lenses of the collimator optical systems of the laser beam source device with respect to the laser beam sources so that the laser beams radiated from the laser beam source device are collimated and follow predetermined optical paths which are parallel to one another. However, it is very troublesome to adjust the positions of the respective lenses with respect to the support member when the laser beam source device is assembled. Therefore, considerable time and labor are required to assemble the laser beam source device. Also, the positions of the lenses which have been adjusted when the laser beam source device is assembled deviate easily when, for example, the ambient temperature changes. Therefore, the accuracy with which the laser beams are radiated from the laser beam source device fluctuates easily with the passage of time.

SUMMARY OF THE INVENTION

The primary object of the present invention is to provide a beam-combining laser beam source device which is easy to assemble and wherein the accuracy with which laser beams are radiated does not fluctuate easily with the passage of time.

Another object of the present invention is to provide a beam-combining laser beam source device wherein a high accuracy of laser beam combination is easily achieved and consistently kept.

The present invention provides a beam-combining laser beam source device which comprises:

(i) a plurality of laser beam sources, (ii) collimator optical systems positioned respectively in the optical paths of laser beams which are radiated from the laser beam sources, each of said collimator optical systems being constituted of a first lens section and a second lens section, (iii) optical path adjusting elements positioned respectively in the optical paths of the laser beams in order to radiate the laser beams along optical paths parallel and close to one another, and (iv) a support member which supports said laser beam sources, said collimator optical systems, and said optical path adjusting elements, wherein each said laser beam source and the corresponding first lens section are combined into a laser beam source unit and mounted on said support member, the positions of said laser beam source and said first lens section having been adjusted with respect to each other, and the second lens section corresponding to said laser beam source unit is mounted on said support member with the position of said second lens section being adjusted with respect to the position of said laser beam source unit in a plane which is normal to the optical axis of said laser beam source unit.

With the beam-combining laser beam source device in accordance with the present invention, each of the collimator optical systems is constituted of the said first lens section and the second lens section. Before the beam-combining laser beam source device is assembled, the first lens section and the corresponding laser beam source are combined into a laser beam source unit with their positions being adjusted with respect to each other. Therefore, when the beam-combining laser beam source device is assembled, the first lens section can be incorporated in the support member without a special operation being required to adjust the position of the first lens section with respect to the position of the corresponding laser beam source. Accordingly, only the position of the second lens section is adjusted with respect to the corresponding laser beam source, and the efficiency with which the beam-combining laser beam source device is assembled is kept high.

In order to adjust the position of the second lens section with respect to the corresponding laser beam source, the second lens section is moved in a plane which is normal to the optical axis of the corresponding laser beam source unit. In cases where the support member is shaped so that the accuracy of the positions of the first lens section (i.e. the corresponding laser beam source unit) and the corresponding second lens section with respect to each other along the optical axis of the corresponding laser beam source unit cannot be kept substantially high, in order to adjust their positions, the first lens section (i.e. the corresponding laser beam source unit) and/or the corresponding second lens section may be moved along the optical axis of the corresponding laser beam source unit. In such cases, the laser beam source unit should preferably be moved along its optical axis. This is because if the second lens section is moved for this purpose it must be moveable in three directions and an expensive movement means is required.

Also, with the beam-combining laser beam source device in accordance with the present invention, the first lens sections incorporated in the laser beam source units do not deviate in position easily with the passage of time. Therefore, the accuracy with which the laser beams are radiated does not easily fluctuate with the passage of time.

DESCRIPTION OF THE PREFERRED EMBODIMENTS

The present invention will hereinbelow be described in further detail with reference to the accompanying drawings.

Figure 1:
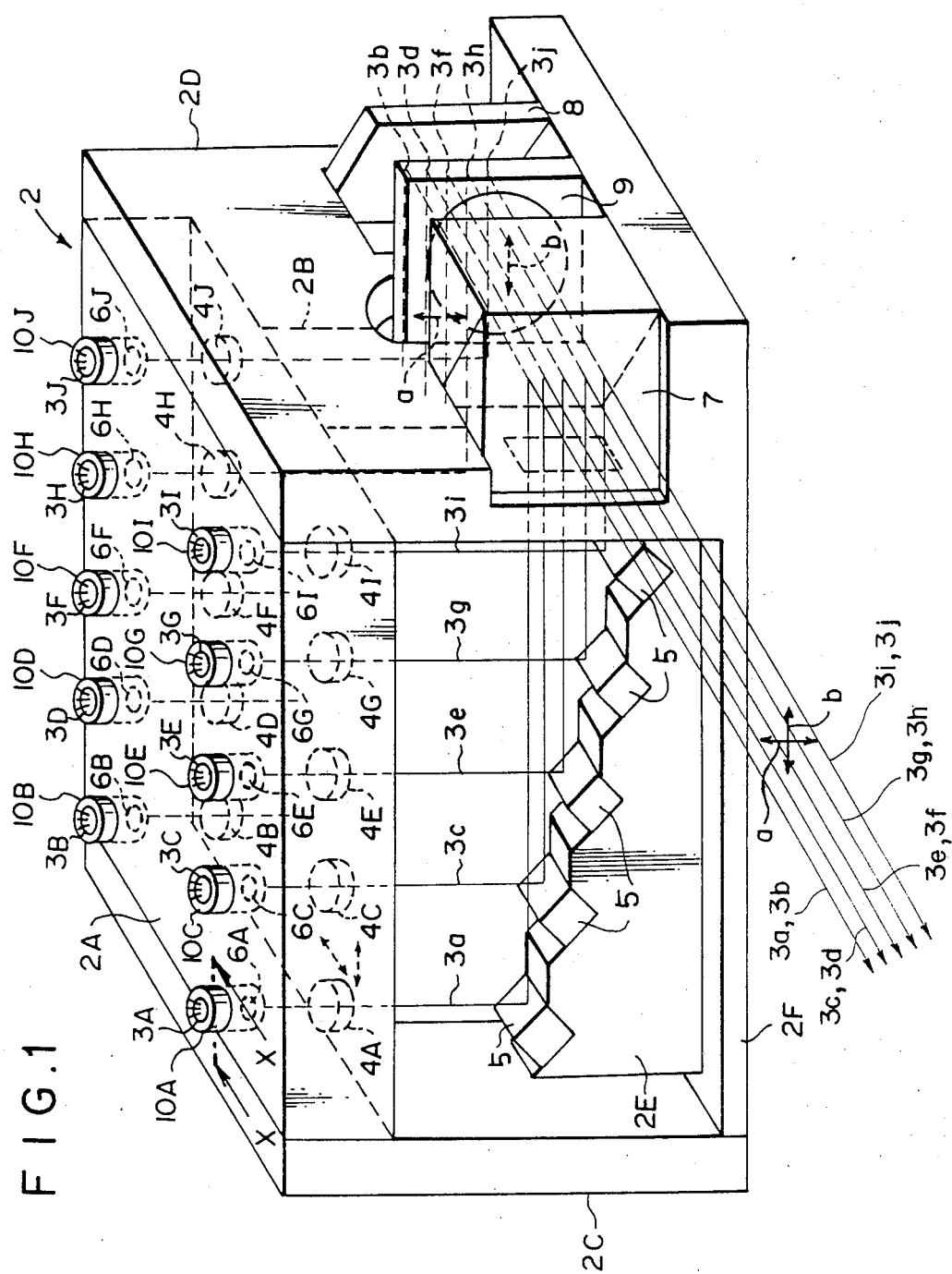
FIG. 1 is a perspective view showing an embodiment of the beam-combining laser beam source device in accordance with the present invention.

With reference to FIG. 1, an embodiment of the beam-combining laser beam source device in accordance with the present invention comprises laser beam source units 10A, 10B, 10C, 10D, 10E, 10F, 10G, 10H, 10I, and 10J which are positioned in two rows and supported in an upper plate 2A of a support member 2. The laser beam source unit 10A comprises a lens barrel; a semiconductor laser 3A and a convex lens 6A are supported in the lens barrel. The convex lens 6A serves as a first lens section. In the same manner, the laser beam source units 10B, 10C, 10D, 10E, 10F, 10G, 10H, 10I, and 10J respectively comprise lens barrels, and semiconductor lasers 3B, 3C, 3D, 3E, 3F, 3G, 3H, 3I, and 3J and convex lenses 6B, 6C, 6D, 6E, 6F, 6G, 6H, 6I, and 6J, which are supported in the lens barrels. The convex lenses 6B, 6C, 6D, 6E, 6F, 6G, 6H, 6I, and 6J serve as first lens sections. The semiconductor lasers 3A through 3J are supported in the upper plate 2A so that their axes of laser beam emission are parallel to one another. Concave lenses 4A, 4B, 4C, 4D, 4E, 4F, 4G, 4H, 4I, and 4J, which serve as second lens sections, are secured to the bottom surface of the upper plate 2A so that they face the laser beam source units 10A through 10J. A pair of mirrors holding plates 2E, 2E (only one of the plates is shown) are secured to the front and rear surfaces of a stay 2B, which constitutes a middle part of the support member 2. Ten reflecting mirrors 5, 5, . . . which act as optical path adjusting elements are secured to the mirror holding plates 2E, 2E, five mirrors on each plate, so that the reflecting mirrors 5, 5, . . . face the concave lenses 4A through 4J. The laser beam source units 10A through 10J, the concave lenses 4A through 4J, and the reflecting mirrors 5, 5, . . . are positioned symmetrically with respect to the stay 2B. A first side plate 2C is secured to one side of the stay 2B, and a second side plate 2D, which supports a polarization beam splitter and a halfwave plate which will be described later, is secured to the other side of the stay 2B. In this embodiment, the support member 2 is constituted of the upper plate 2A, the stay 2B, the first side plate 2C, the second side plate 2D, the mirror holding plates 2E, 2E, and a lower plate 2F which is secured to the lower edge face of the stay 2B. The support member 2 is constituted of a material exhibiting a small coefficient of linear expansion, such as Nobinite, Kovar, Inver, or a ceramic material.

Figure 2:
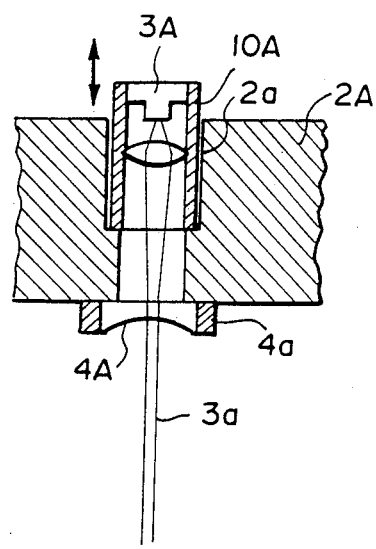
FIG. 2 is a sectional view taken along line X—X in FIG. 1.

Convex lenses 6A through 6J, which serve as the first lens sections, are provided inside of the laser beam source units 10A through 10J so that they face the semiconductor lasers 3A through 3J. (By way of example, FIG. 2 shows the convex lens 6A facing the semiconductor laser 3A). In this embodiment, a collimator optical system corresponding to the semiconductor laser 3A is constituted of the concave lens 4A and the convex lens 6A. Also, collimator optical systems corresponding to the semiconductor lasers 3B through 3J are respectively constituted of the concave lenses 4B through 4J and the convex lenses 6B through 6J. As shown in FIG. 2, a laser beam 3a produced by the semiconductor laser 3A is passed through and collimated by the collimator optical system. In the same manner, laser beams 3b through 3j produced by the semiconductor lasers 3B through 3J are collimated by corresponding collimator optical systems provided in the optical paths of the laser beams 3b through 3j.

The laser beams 3a, 3c, 3e, 3g, and 3i, after being collimated, are reflected by the reflecting mirrors 5, 5, . . . provided therebelow, and impinge upon a polarization beam splitter 7. The semiconductor lasers 3A, 3C, 3E, 3G, and 3I of the laser beam source units 10A, 10C, 10E, 10G, and 10I are positioned in the upper plate 2A so as to radiate the laser beams 3a, 3c, 3e, 3g, and 3i in a single plane. Also, the reflecting mirrors 5, 5, . . . provided in the optical paths of the laser beams 3a, 3c, 3e, 3g, and 3i are held by the mirror holding plate 2E, which has a step-like upper face, so that they are vertically deviated little by little from one another as shown in FIG. 1. Therefore, the positions from which the laser beams 3a, 3c, 3e, 3g, and 3i are reflected by the reflecting mirrors 5, 5, . . . vary gradually but only in the vertical direction; and the laser beams 3a, 3c, 3e, 3g, and 3i after being reflected by the reflecting mirrors 5, 5, . . . follow optical paths which are parallel and very close to one another in the vertical direction. Also, on the rear side of the stay 2B, laser beams 3b, 3d, 3f, 3h, and 3j produced by the semiconductor lasers 3B, 3D, 3F, 3H, and 3J are reflected by the reflecting mirrors 5, 5, . . . and then follow optical paths which are parallel and very close to one another in the vertical direction. As for the laser beams produced by each pair of the semiconductor lasers provided facing each other with the stay 2B intervening therebetween (i.e. the laser beams 3a and 3b, the laser beams 3c and 3d, and so on), the heights of the respective pairs of laser beams are equal to each other after the laser beams are reflected by corresponding reflecting mirrors 5, 5. Furthermore, the laser beam source units 10A through 10J are secured to the upper plate 2A so that the directions of polarization of the laser beams 3a through 3j, after being reflected by the reflecting mirrors 5, 5, . . . , are the same (i.e. the direction coincides with the direction indicated by the arrow "a" in FIG. 1). The second side plate 2D is provided with openings through which the laser beams 3a through 3j, after being reflected by the reflecting mirrors 5, 5, . . . , pass.

Figure 3:
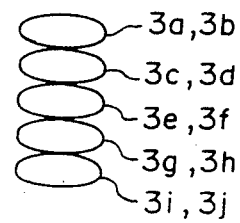
FIG. 3 is a schematic view showing cross-sections of laser beams radiated from the beam-combining laser beam source device shown in FIG. 1.

The polarization beam splitter 7 reflects light polarized in the direction indicated by the arrow "a". Therefore, the laser beams 3a, 3c, 3e, 3g, and 3i are reflected by the polarization beam splitter 7. On the other hand, the laser beams 3b, 3d, 3f, 3h, and 3j are reflected by a mirror 8 so that the directions of their optical paths are changed by an angle of approximately 90°. Then, the laser beams 3b, 3d, 3f, 3h, and 3j are passed through a halfwave plate 9 so that the direction of polarization is changed by an angle of 90°, and the laser beams 3b, 3d, 3f, 3h, and 3j are converted to light polarized in the direction indicated by the arrow "b". The polarization beam splitter 7 transmits light polarized in the direction indicated by the arrow "b". Therefore, the laser beams 3b, 3d, 3f, 3h, and 3j after being polarized in the direction indicated by the arrow "b" pass through the polarization beam splitter 7. The laser beam 3b is radiated along the same optical path as the laser beam 3a; and the laser beam 3d is radiated along the same optical path as the laser beam 3c. Also, the laser beam 3f is radiated along the same optical path as the laser beam 3e; the laser beam 3h is radiated along the same optical path as the laser beam 3g; and the laser beam 3j is radiated along the same optical path as the laser beam 3i. FIG. 3 shows cross-sections of the laser beams 3a through 3j radiated along the optical paths parallel and close to one another.

When the beam-combining laser beam source device described above is assembled, in order to accurately radiate the laser beams 3a through 3j, it is necessary to accurately adjust the positions of the optical elements of the collimator optical systems. The convex lenses 6A through 6J, which constitute the first lens sections of the collimator optical systems, are combined with the semiconductor lasers 3A through 3J into the laser beam source units 10A through 10J, so that the convex lenses 6A through 6J take predetermined positions with respect to the semiconductor lasers 3A through 3J. When being mounted on the upper plate 2A of the support member 2, the concave lenses 4A through 4J, which constitute the second lens sections of the collimator optical systems, can be moved two-dimensionally in a plane which is normal to the optical axes of the laser beam source units 10A through 10J. (The directions along which the concave lens 4A is moved are indicated by the double headed arrows in FIG. 1). Specifically, in the course of the beam-combining laser beam source device being assembled, the laser beam source units 10A through 10J are first fitted into holes 2a, 2a, . . . which are formed in the upper plate 2A. (The hole 2a for the laser beam source unit 10A is shown in FIG. 2). Thereafter, the concave lenses 4A through 4J are positioned on the bottom surface of the upper plate 2A so that they face the laser beam source units 10A through 10J. The concave lenses 4A through 4J are moved in two directions in order to adjust their positions on the bottom surface of the upper plate 2A. After being positioned at the predetermined positions, the concave lenses 4A through 4J are secured to the upper plate 2A. For example, an adhesive is introduced for this purpose into the space formed between holding frames for the concave lenses 4A through 4J and the bottom surface of the upper plate 2A. (The holding frame 4a for the concave lens 4A is shown in FIG. 2). Also, in order to adjust the positions of the collimator optical systems along the optical axes of the laser beams 3a through 3j, the laser beam source units 10A through 10J are moved vertically, as indicated by the double headed arrow for the laser beam source unit 10A in FIG. 2. The circumferential surfaces of the laser beam source units 10A through 10J and of the holes 2a, 2a, . . . of the upper plate 2A may be threaded in order to facilitate the vertical movements of the laser beam source units 10A through 10J.

In order to investigate whether or not the optical paths of the laser beams 3a through 3j and the points at which the laser beams 3a through 3j are focused have been adjusted accurately through the movements of the concave lenses 4A through 4J and the laser beam source units 10A through 10J, a detection means may be used to detect whether the laser beams 3a through 3j, which have been combined by the polarization beam splitter 7 and which have passed through a converging lens (not shown), are converged to a predetermined spot. Alternatively, a semi-transparent mirror (not shown) may be positioned in the optical paths of the laser beams 3a through 3j, which have been combined, in order to take up parts of the laser beams 3a through 3j as monitor light. The monitor light is then converged, and a position sensor is used in order to investigate whether or not the monitor light is converged to a predetermined position and to a predetermined spot diameter.

With this embodiment, the convex lenses 6A through 6J, which constitute the first lens sections, have been built in the laser beam source units 10A through 10J together with the semiconductor lasers 3A through 3J. Therefore, when the beam-combining laser beam source device is assembled, no particular operations are required to adjust the positions of the convex lenses 6A through 6J with respect to the positions of the semiconductor lasers 3A through 3J. In order to adjust the positions of the optical elements with respect to the semiconductor lasers 3A through 3J, only the concave lenses 4A through 4J, which constitute the second lens sections, may be moved. Therefore, during the assembling of the beam-combining laser beam source device the positions of the collimator optical systems can be adjusted quickly and easily. Also, even if the ambient temperature or the like changes, little change arises in the relationship between the positions of the first lens sections and the semiconductor lasers 3A through 3J. Therefore, the accuracy with which the laser beams 3a through 3j are radiated from the beam-combining laser beam source device can be kept high.

The second lens sections may be supported so that their positions can be readjusted after the beam-combining laser beam source device has been assembled in order to compensate for changes in their positions which arise with the passage of time. Each of the first lens sections and/or each of the second lens sections may be constituted of a plurality of lenses positioned in the optical path of a single laser beam. Also, part or all of the upper plate 2A, the stay 2B, the side plates 2C and 2D, the mirror holding plates 2E, 2E, and the lower plate 2F of the support member 2, which supports the optical elements of the beam-combining laser beam source device, should preferably be manufactured by an integral molding method. The integral molding method facilitates the processing and assembly of the support member 2; and the beam combining accuracy of the beam-combining laser beam source device improves because the support member 2 is free of the problem of joined parts deviating in position due to deterioration with the passage of time.

Another embodiment of the beam-combining laser beam source device in accordance with the present invention will be described hereinbelow.

Figure 4:
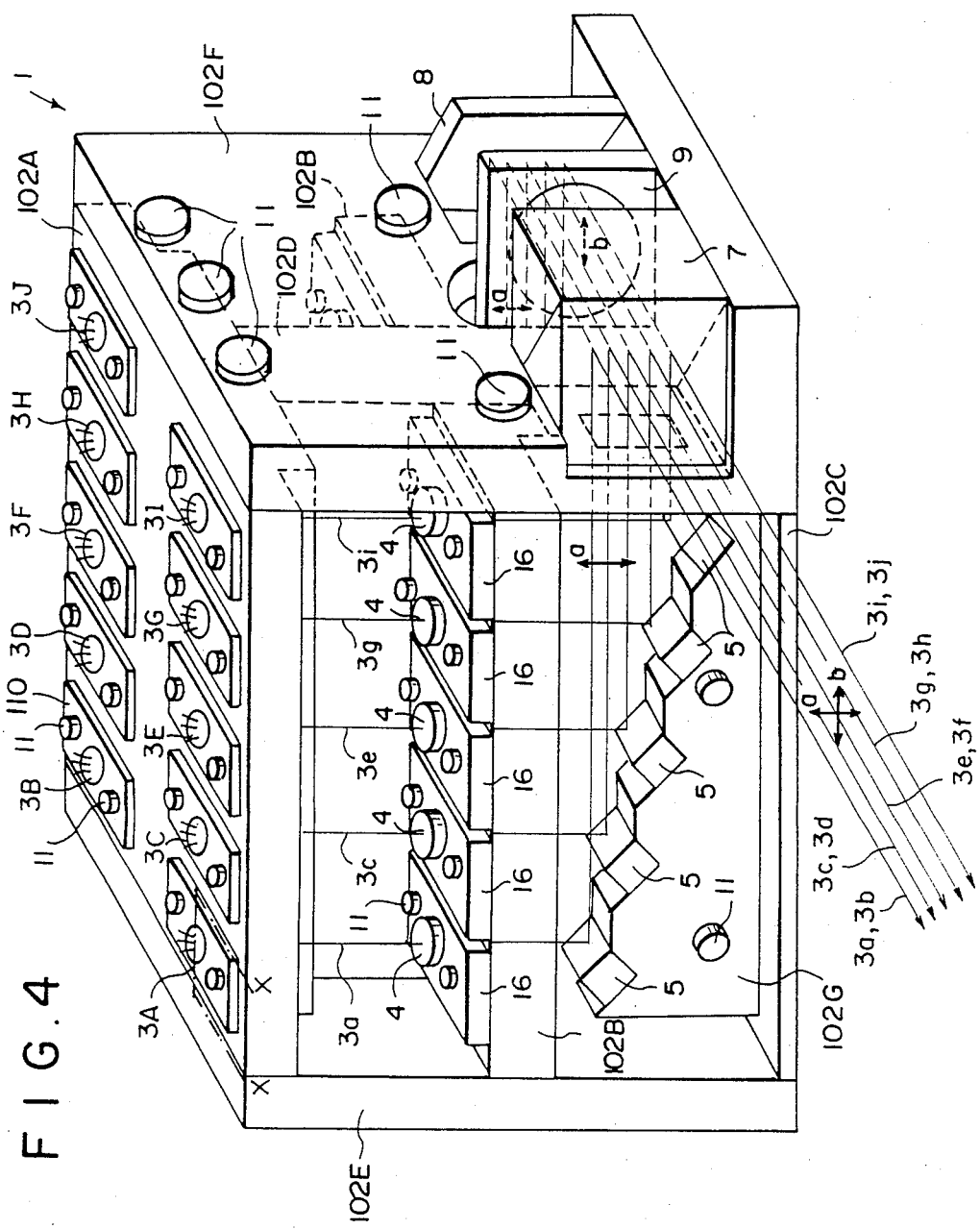
FIG. 4 is a perspective view showing another embodiment of the beam-combining laser beam source device in accordance with the present invention.
Figure 5:
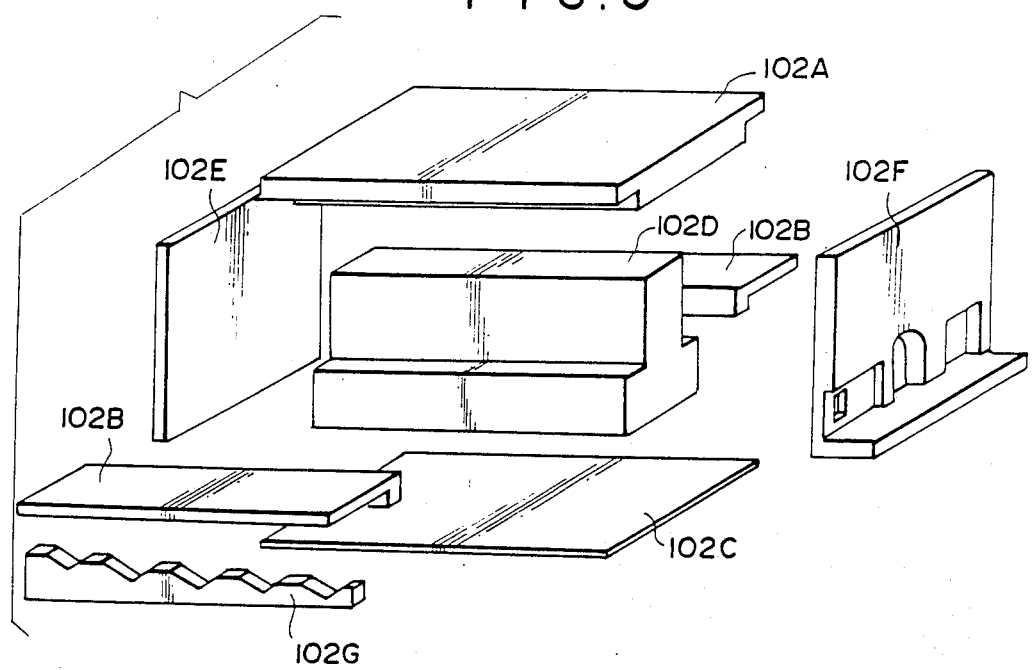
FIG. 5 is a developed perspective view showing a means for supporting optical elements in the embodiment of FIG. 4.

FIG. 4 is a perspective view showing this embodiment of the beam-combining laser beam source device in accordance with the present invention, and FIG. 5 is a developed perspective view showing a means for supporting optical elements in this embodiment.

The beam-combining laser beam source device 1 shown comprises, by way of example, ten semiconductor lasers 3A, 3B, 3C, 3D, 3E, 3F, 3G, 3H, 3I, and 3J which are positioned in two rows and secured to a laser holding plate 102A so that their axes of laser beam emission are parallel to one another. The laser holding plate 102A is secured to the upper surface of a stay 102D. The semiconductor lasers 3A through 3J are supported by holding frames 110, 110, . . . , which are secured by screws 11, 11, . . . to the laser holding plate 102A. A pair of lens holding plates 102B, 102B are secured to the middle portion of the stay 102D. Ten concave lenses 4, 4, . . . which are secured by screws 11, 11, . . . to supporting frames 16, 16, . . . are mounted on the lens holding plates 102B, 102B, five lenses on each plate, so that they face the semiconductor lasers 3A through 3J. Also, a pair of mirror holding plates 102G, 102G (only one of the plates is shown) are secured by screws 11, 11, . . . to the lower portion of the stay 102D. Ten reflecting mirrors 5, 5, . . . which act as optical path adjusting elements are secured to the mirror holding plates 102G, 102G, five mirrors on each plate, so that the reflecting mirrors 5, 5, . . . face the concave lenses 4, 4, . . . . The semiconductor lasers 3A through 3J, the concave lenses 4, 4, . . . and the reflecting mirrors 5, 5, . . . are positioned symmetrically with respect to the stay 102D. A side plate 102E is secured by screws 11, 11, . . . to one side of the stay 102D; and an optical element holding plate 102F which supports a polarization beam splitter and a halfwave plate is secured by screws 11, 11, . . . to the other side of the stay 102D. Also, a bottom plate 102C is secured to the bottom face of the stay 102D.

Figure 6:
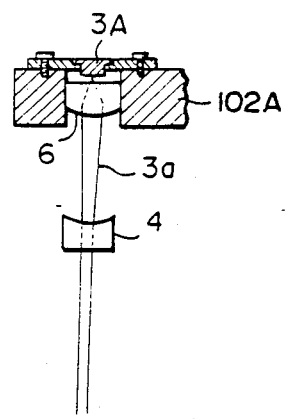
FIG. 6 is a sectional view taken along line X—X in FIG. 4, FIGS. 7A, 7B, 8A, 8B, 9A, and 9B are schematic views showing examples of means for fixing the beam-combining laser beam source device to a base plate.

Convex lenses 6, 6, . . . (not shown in FIG. 4) are provided inside the laser holding plate 102A so that they face the semiconductor lasers 3A through 3J. (By way of example, FIG. 6 shows the convex lens 6 facing the semiconductor laser 3A.) In this laser beam source unit 1, a collimator optical system is constituted of the concave lens 4 and the convex lens 6. As shown in FIG. 6, a laser beam 3a produced by the semiconductor laser 3A is passed through and collimated by the collimator optical system. In the same manner, laser beams 3b through 3j produced by the semiconductor lasers 3B through 3J are collimated by corresponding collimator optical systems provided in the optical paths of the laser beams 3b through 3j.

The laser beams 3a, 3c, 3e, 3g, and 3i, after being collimated, are reflected by the reflecting mirrors 5, 5, . . . provided therebelow, and impinge upon a polarization beam splitter 7. The semiconductor lasers 3A, 3C, 3E, 3G, and 3I are positioned so as to radiate the laser beams 3a, 3c, 3e, 3g, and 3i in a single plane. Also, the reflecting mirrors 5, 5, . . . provided in the optical paths of the laser beams 3a, 3c, 3e, 3g, and 3i are held by the mirror holding plate 2G, which has a step-like upper face, so that they gradually deviate vertically from one another as shown in FIG. 4.

Therefore, the positions from which the laser beams 3a, 3c, 3e, 3g, and 3i are reflected by the reflecting mirrors 5, 5, . . . gradually vary only in the vertical direction, and the laser beams 3a, 3c, 3e, 3g, and 3i after being reflected by the reflecting mirrors 5, 5, . . . follow optical paths which are parallel and very close to one another in the vertical direction. Also, on the rear side of the stay 102D, laser beams 3b, 3d, 3f, 3h, and 3j produced by the semiconductor lasers 3B, 3D, 3F, 3H, and 3J are reflected by the reflecting mirrors 5, 5, . . . and then follow optical paths which are parallel and very close to one another in the vertical direction. As for the laser beams produced by each pair of the semiconductor lasers which face each other with the stay 102D intervening therebetween (i.e. the laser beams 3a and 3b, the laser beams 3c and 3d, and so on) the heights of the respective pairs of laser beams are equal to each other after the laser beams are reflected by corresponding reflecting mirrors 5, 5. Furthermore, the semiconductor lasers 3A through 3J are secured to the laser holding plate 102A so that the directions of polarization of the laser beams 3a through 3j, after being reflected by the reflecting mirrors 5, 5, . . . , are the same (i.e. the direction coincides with the direction indicated by the arrow "a" in FIG. 4). The optical element holding plate 102F has openings through which the laser beams 3a through 3j, after being reflected by the reflecting mirrors 5, 5, . . . , pass.

The polarization beam splitter 7 reflects light polarized in the direction indicated by the arrow "a". Therefore, the laser beams 3a, 3c, 3e, 3g, and 3i are reflected by the polarization beam splitter 7. On the other hand, the laser beams 3b, 3d, 3f, 3h, and 3j are reflected by a mirror 8 so that the directions of their optical paths are changed by an angle of approximately 90°. Then, the laser beams 3b, 3d, 3f, 3h, and 3j are passed through a halfwave plate 9 so that the direction of polarization is changed by an angle of 90°, and the laser beams 3b, 3d, 3f, 3h, and 3j are converted to light polarized in the direction indicated by the arrow "b". The polarization beam splitter 7 transmits light polarized in the direction indicated by the arrow "b". Therefore, the laser beams 3b, 3d, 3f, 3h, and 3j after being polarized in the direction indicated by the arrow "b" pass through the polarization beam splitter 7. The laser beam 3b is radiated along the same optical path as the laser beam 3a, and the laser beam 3d is radiated along the same optical path as the laser beam 3c. Also, the laser beam 3f is radiated along the same optical path as the laser beam 3e; the laser beam 3h is radiated along the same optical path as the laser beam 3g; and the laser beam 3j is radiated along the same optical path as the laser beam 3i. FIG. 3 shows cross-sections of the laser beams 3a through 3j radiated along the optical paths parallel and close to one another.

The beam-combining laser beam source device 1 is secured to a base plate when being used. How it is secured to the base plate will be described hereinbelow.

FIGS. 7A, 8A, and 9A are horizontal sectional views showing examples of fixing means which secure the beam-combining laser beam source device 1 to the base plate. FIGS. 7B, 8B, and 9B are vertical sectional views showing the examples of the fixing means.

The beam-combining laser beam source device 1 is mounted on a base plate 12 with the stay 102D being secured to the base plate 12. In the embodiment of FIG. 4, the bottom plate 102C is provided to protect the parts of the beam-combining laser beam source device 1, and is mounted on the base plate 12 in order to secure the stay 102D thereto. However, the bottom plate 102C need not necessarily be provided. In the embodiment of FIGS. 7A and 7B, the stay 102D is secured to the base plate 12 with a slight space intervening therebetween by screws 13, 13, which are located side by side in the longitudinal direction of the bottom face of the stay 102D. Cushioning materials 14, 14 are provided around the screws 13, 13 between the beam-combining laser beam source device 1 and the base plate 12. In the embodiment of FIGS. 8A and 8B, one of the screws 13, 13, used in the embodiment of FIGS. 7A and 7B, is replaced by a spring 15. In the embodiment of FIGS. 9A and 9B, the middle portion of the bottom face of the stay 102D is secured by a single screw 13 to the base plate 12, and a comparatively large annular cushioning material 14' is located around the screw 13.

With the embodiments shown in FIGS. 7A, 7B, 8A, 8B, 9A, and 9B, the beam-combining laser beam source device 1 is mounted on the base plate 12 with a slight space intervening therebetween by one or two screws. Therefore, the beam-combining laser beam source device 1 is not deformed when it is secured by the screw to the base plate 12. Even if the base plate 12 is deformed due to a change in the ambient temperature, the beam-combining laser beam source device 1 will not be adversely affected by the deformation of the base plate 12. Therefore, in cases where the positions of the respective optical elements of the beam-combining laser beam source device 1 are adjusted accurately, the accuracy with which the optical elements are positioned is not diminished even though the beam-combining laser beam source device 1 is mounted on the base plate 12. Moreover, a fixing means such as a screw is applied to the stay 102D; and all optical elements of the beam-combining laser beam source device 1 are mounted on the supports which are secured to the stay 102D. Therefore, even if the stay 102D has a slightly deviated position with respect to the base plate 12, the relationship between the positions of the optical elements do not change, and the accuracy with which the laser beams are radiated from the beam-combining laser beam source device 1 does not lessen. A cushioning material need not necessarily be provided in cases where little deformation arises with the stay 102D when it is secured by a screw or the like to the base plate 12.

Figure 10A:
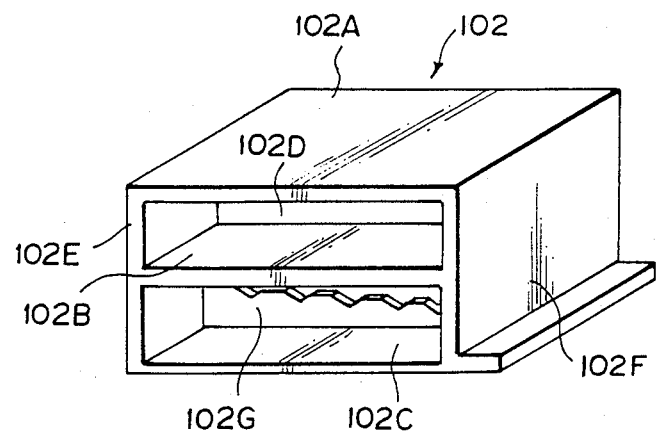
FIGS. 10A and 10B are perspective views showing examples of support member units obtained from integral molding.
Figure 10B:
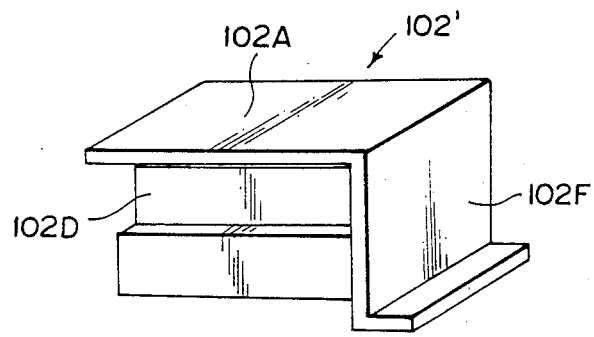

In the beam-combining laser beam source device 1, the laser holding plate 102A, the lens holding plates 102B, 102B, the bottom plate 102C, the stay 102D, the side plate 102E, the optical element holding plate 102F, and the mirror holding plates 102G, 102G, which directly or indirectly support the optical elements, are manufactured separately and then combined with screws or the like. However, part or all of these members may be molded integrally. FIG. 10A shows a support member unit 102 comprising the laser holding plate 102A, the lens holding plates 102B, 102B, the bottom plate 102C, the stay 102D, the side plate 102E, the optical element holding plate 102F, and the mirror holding plates 102G, 102G, which are molded integrally. FIG. 10B shows a support member unit 102', wherein only the laser holding plate 102A, the stay 102D, and the optical element holding plate 102F are molded integrally. Alternatively, only the laser holding plate 102A, the lens holding plates 102B, 102B, the stay 102D, and the optical element holding plate 102F are molded integrally. As another alternative, only the laser holding plate 102A, the lens holding plates 102B, 102B, and the stay 102D are molded integrally. As a final alternative, only the laser holding plate 102A and the stay 102D, or only the lens holding plates 102B, 102B, and the stay 102D are molded integrally.

In cases where part or all of the members for holding or supporting the optical elements are manufactured with the integral molding method, the number of parts can be kept minimal and the labor required to accurately process the joined faces of the members can be reduced. Therefore, the manufacturing cost can be kept low and the time required to assemble the beam-combining laser beam source device 1 can be shortened. Also, the beam combining accuracy of the beam-combining laser beam source device 1 can be improved because the device is free of the problem of joined parts deviating in position due to a change in the ambient temperature, deterioration with the passage of time, or the like.

What is claimed is:

1. A beam-combining laser beam source device which comprises:
   (i) a plurality of laser beam sources,
   (ii) collimator optical systems respectively positioned in optical paths of laser beams which are radiated from the laser beam sources, each of said collimator optical systems being constituted of a first lens section and a second lens section,
   (iii) optical path adjusting elements respectively positioned in the optical paths of the laser beams in order to radiate the laser beams along optical paths parallel and close to one another, and
   (iv) a support member which supports said laser beam sources, said collimator optical systems, and said optical path adjusting elements,
   wherein each said laser beam source and the corresponding first lens section are combined into a laser beam source unit and mounted on said support member, the positions of said laser beam source and said first lens section having been adjusted with respect to each other, and
   said second lens section corresponding to said laser beam source unit mounted on said support member with the position of said second lens section being adjusted with respect to the position of said laser beam source unit in a plane which is normal to the optical axis of said laser beam source unit.

2. A device as defined in claim 1, wherein said laser beam source unit is mounted so that it is moveable along its optical axis.

3. A device as defined in claim 1, wherein said support member is constituted of a material having a low coefficient of linear expansion.

4. A device as defined in claim 3, wherein said support member comprises one of a Nobinite, Kovar, Inver, and a ceramic material.

5. A device as defined in claim 1, wherein part or whole of said support member is molded integrally.

6. A beam-combining laser beam source device which is mounted on a base plate and which comprises:
   (i) a plurality of laser beam sources,
   (ii) collimator optical systems respectively positioned in optical paths of laser beams, which are radiated from the laser beam sources, in order to collimate said laser beams, and
   (iii) optical path adjusting elements respectively positioned in the optical paths of the laser beams in order to radiate the laser beams along optical paths parallel and close to one another,
   wherein said laser beam sources, said collimator optical systems and said optical path adjusting elements are mounted on a stay, which extends along a direction which is approximately normal to said base plate, directly or via supports, and
   said stay is secured to said base plate, whereby said beam-combining laser beam source device is mounted on said base plate.

7. A device as defined in claim 6, wherein said stay is secured to said base plate with a slight space intervening therebetween.

8. A device as defined in claim 6 or 7, wherein said stay is secured by a fixing means to said base plate, and a cushioning material is provided around said fixing means and at a position between said stay and said base plate.

9. A device as defined in claim 6, wherein part or all of said stay and said supports is molded integrally.

* * * * *